United States Patent [19]

Danielsen et al.

[11] Patent Number: 4,658,439

[45] Date of Patent: Apr. 14, 1987

[54] HOUSING FOR A RADIO APPARATUS

[75] Inventors: Geir Danielsen, Oslo, Norway; Heiner Thomfohrde, Hohenschaeftlarn, Fed. Rep. of Germany

[73] Assignee: Siemens Aktiengesellschaft, Berlin and Munich, Fed. Rep. of Germany

[21] Appl. No.: 734,612

[22] Filed: May 16, 1985

[30] Foreign Application Priority Data

May 24, 1984 [DE] Fed. Rep. of Germany ....... 3419416

[51] Int. Cl.$^4$ .................. H04B 1/08; H04B 1/38; H04B 1/10
[52] U.S. Cl. .................................. 455/301; 455/90; 455/348; 455/351
[58] Field of Search ................ 455/89, 90, 345–349, 455/351, 300, 301; 361/380, 422, 424

[56] References Cited

U.S. PATENT DOCUMENTS

| 3,071,728 | 1/1963 | Grace et al. ................ 455/346 |
| 3,091,736 | 5/1963 | Germain . | |
| 3,178,891 | 4/1965 | Sharma ...................... 455/351 |
| 3,348,148 | 10/1967 | Parsons et al. ............... 455/90 |
| 3,667,045 | 5/1972 | Combs ....................... 455/90 |
| 3,723,882 | 3/1973 | Carlson ..................... 455/301 |
| 3,997,819 | 12/1976 | Eggert et al. . | |
| 4,325,142 | 4/1982 | Nakazawa .................. 455/351 |

FOREIGN PATENT DOCUMENTS

| 0098587 | 1/1984 | European Pat. Off. . |
| 0105717 | 4/1984 | European Pat. Off. . |
| 2806186 | 8/1978 | Fed. Rep. of Germany . |
| 2746221 | 4/1979 | Fed. Rep. of Germany . |
| 3225627 | 1/1984 | Fed. Rep. of Germany . |
| WO81/03598 | 12/1981 | PCT Int'l Appl. . |
| 1258485 | 12/1971 | United Kingdom . |
| 1583021 | 1/1981 | United Kingdom . |

OTHER PUBLICATIONS

"COMCO Model 812 Portacom", 1/29/74.

Primary Examiner—Jin F. Ng

[57] ABSTRACT

The invention relates to a flat pack or housing for a radio apparatus having a rectangular cross-section comprising an opening at the front side and an opening at the back side which are respectively closable with a cover and also relates to a support mount for the radio apparatus. Such a radio apparatus provides the user with the possibility of versatile use at various use locations and is securable in a receptacle. To this end, the housing is divided into two tub-shaped main chambers by a bottom plate oriented parallel to the plane of the openings. The individual assemblies of the radio apparatus are disposed RF-shielded in the main chambers and the main chambers being closed by the covers by means of a central screw. Outside guide rails for acceptance into the support mount are disposed at opposite lateral faces of the housing. The support mount is composed of a sheet metal panel bent at three sides. The lower, bent part of the panel forms a chamber with a further bent sheet metal part which carries contacting elements and further assemblies for additional functions of the radio apparatus are accommodated in said latter chamber. A carrying shackle pivotable by 90° is attached at the upper side of the radio apparatus. This carrying shackle provides a latching function when the radio apparatus is inserted in the support mount.

14 Claims, 8 Drawing Figures

HOUSING FOR A RADIO APPARATUS

BACKGROUND OF THE INVENTION

1. Field of the Invention

The invention relates to a flat pack or housing having a rectangular cross-section for a radio apparatus, comprising an opening at the front side and an opening at the back side which are respectively closable with a cover and also relates to a support mount for the radio apparatus.

2. Description of the Prior Art

A flat pack or housing is disclosed, for example, by the German Pat. No. 32 25 627. That housing comprises partitions extending in longitudinal direction for the formation of chambers with guides for printed circuit boards of standardized size and assemblies. The covering for the opening of the back side is composed of a cover and the covering for the opening at the front side is composed of a tub-shaped cooling member comprising cooling ribs at the outside thereof and a cavity at the inside thereof in which cavity the heat-generating assemblies and the internal wiring are disposed. The cavity is closed by means of a backplane printed circuit board, the outside containing the plug contact elements for the connection of the printed circuit boards to one another and to the assemblies disposed in the cooling member.

A radio apparatus that can be used for the transmission of voice and data both at a fixed position as well as in mobile use should be as small and light as possible and also rugged and RF-, dust- and water-tight at the same time.

In order to provide the user with the possibility of using the same radio apparatus at different use locations, it is desirable to provide a means for accepting the radio apparatus, protecting it against unauthorized removal and enabling auxiliary devices such as monitoring and speaking possibilites as well as, for example, data devices to be attached in a simple fashion without performing operations on the radio apparatus itself.

SUMMARY OF THE INVENTION

An object of the invention is to provide a flat pack or housing for a radio apparatus such that it meets the above demands and enables a versatile application and sure acceptance and mounting of the radio apparatus.

This object is achieved in accord with the invention in such fashion that the flat pack or housing of the type described is divided into two tub-shaped main chambers by a bottom plate oriented parallel to the plane of the opening at the broad sides of the housing. The radio assemblies (transmitter, receiver, etc.) are preferably composed of printed circuit boards equipped with components as well as antenna and control devices and are disposed RF-shielded in the main chambers. Plug connector elements for the electrical connection of the devices in both main chambers are provided in the bottom plate of the housing in a central position. The covers for the tub-shaped main chambers are in contact with housing seal elements which are in turn disposed recessed on all sides. The covers are secured to one another and to the flat pack or housing via a single central screw. Outside guide rails for acceptance into a support mount are applied to the flat pack or housing at the two opposite side faces and a pivotable carrying shackle is attached to the top side thereof, this shackle serving for latching when the radio apparatus is inserted into the support mount.

BRIEF DESCRIPTION OF THE DRAWINGS

The invention shall be explained in greater detail below with reference to an exemplary embodiment shown in the drawing. Shown therein are.

DESCRIPTION OF THE PREFERRED EMBODIMENTS

Figure 1:
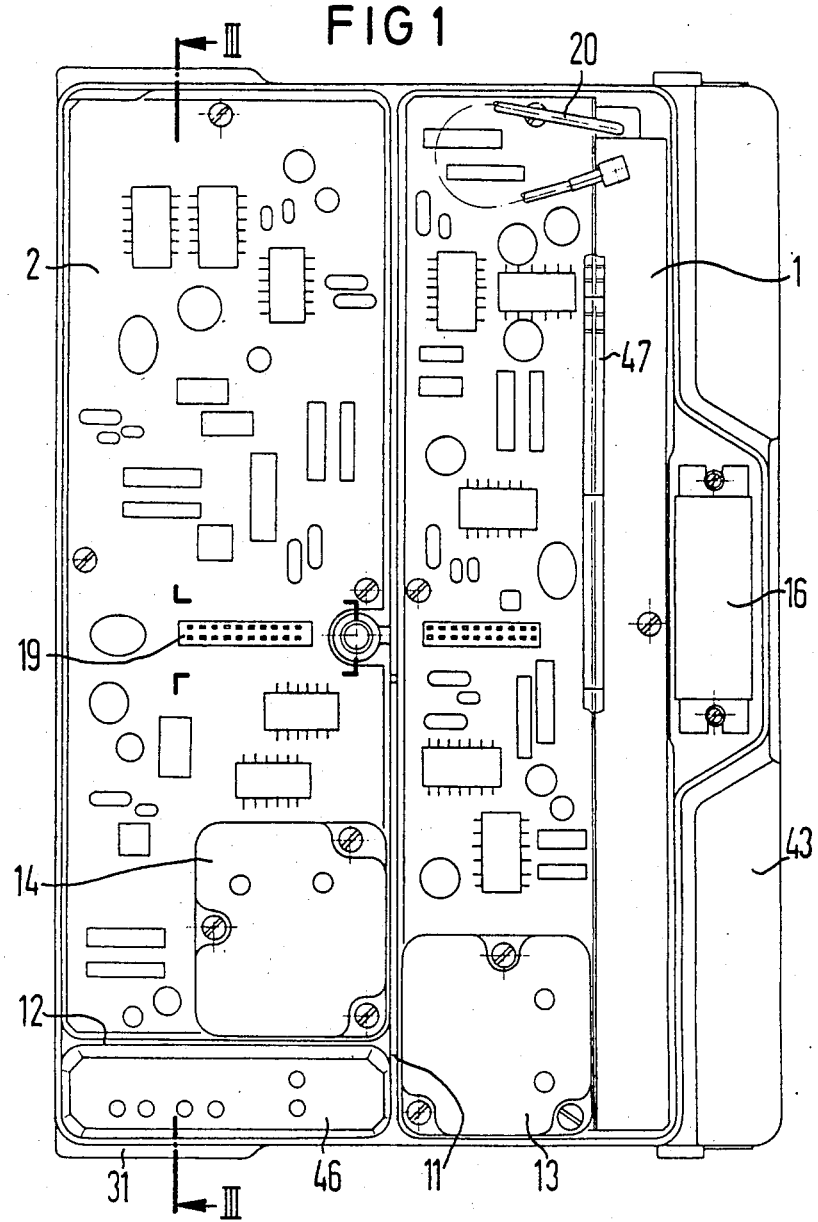
FIG. 1 is a view of the front side of the equipped flat pack or housing with covers removed.
Figure 2:
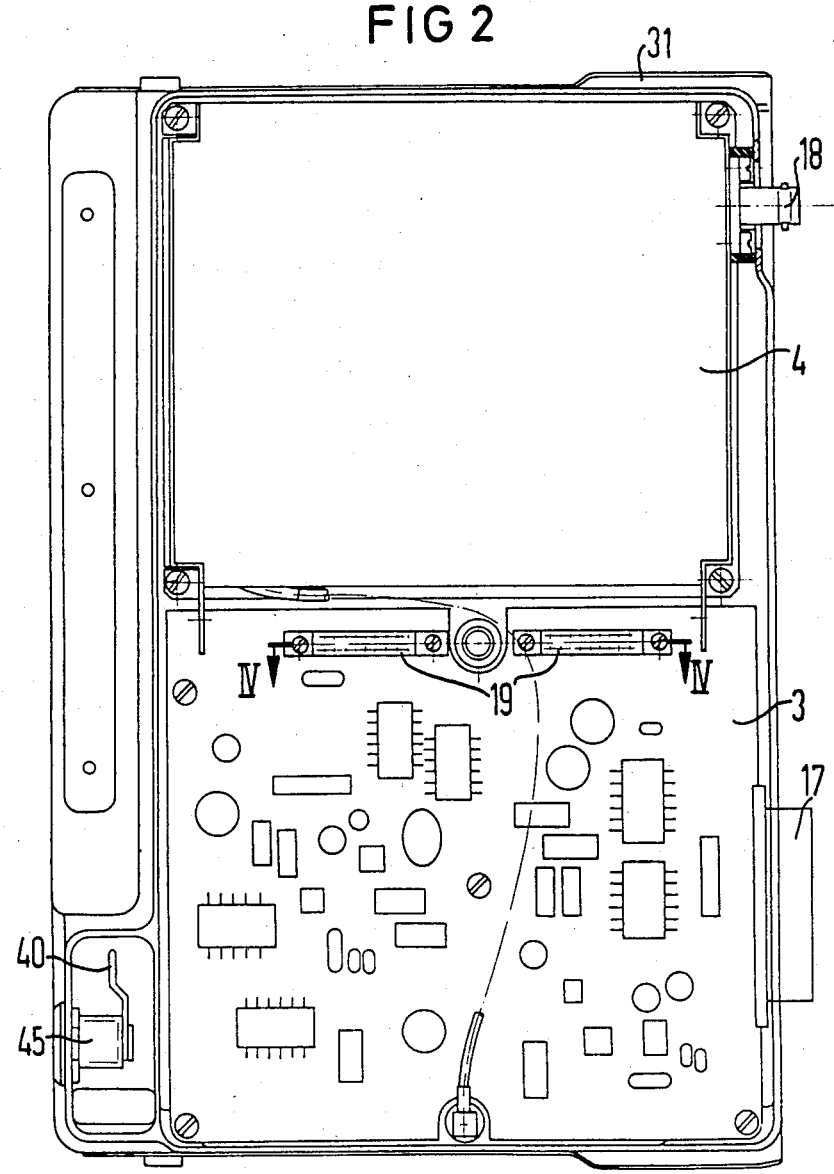
FIG. 2 is a view of the back side of the equipped flat pack or housing with covers removed.
Figure 3:
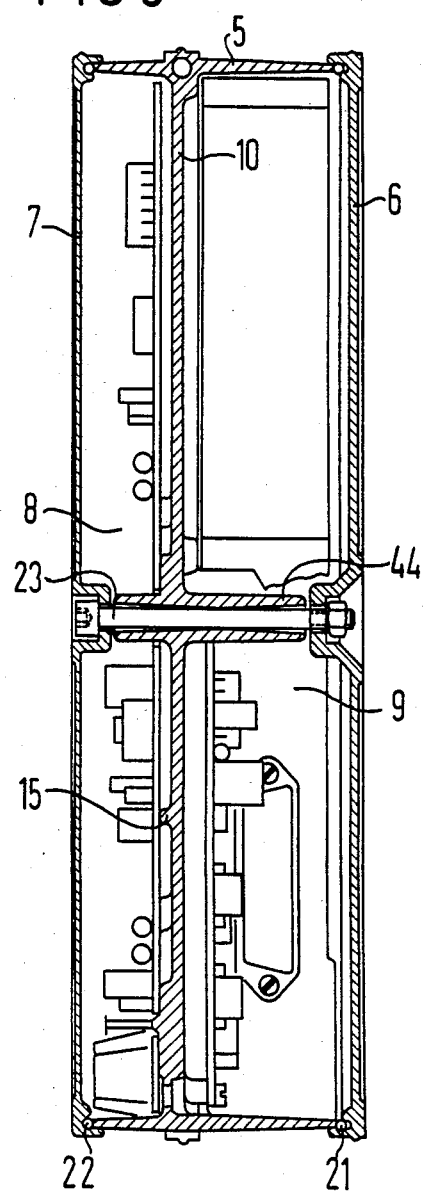
FIG. 3 is the equipped flat pack or housing in a side sectionalview.

The structure of the flat pack or housing shall be described with reference to FIGS. 1 through 3 which show the flat pack or housing in a back view and a front view with covers removed as well as in a section proceeding parallel to the narrow sides. The flat pack or housing is composed of a weatherproof, rugged pressure diecast housing 5 of aluminum having a rectangular cross-section whose broad sides forming the front side and back side are open. These sides are closed by covers 6, 7 (FIG. 3). A co-cast bottom plate 10 is disposed in the interior of the flat housing in a plane oriented parallel to the covers, this bottom plate 10 dividing the interior of the housing into two flat, tub-like main chambers 8, 9. The radio assemblies, namely the transmitter 1 and the receiver 2 (FIG. 1) are accomodated in the main chamber 8 lying to the left of the bottom plate 10 in FIG. 3. The antenna signal splitter 4, such as a duplex filter adapted to receive radio signals, and a digital control 3 (FIG. 2) are situated in the main chamber 9 lying opposite.

The transmission and reception assemblies 1, 2 are preferably composed of printed circuit boards equipped with appropriate components. In order to RF shield the transmission and reception assemblies from one another, one or more partitions 11, 12 are co-cast between them perpendicular to the floor or bottom plate 10, these partitions expediently contacting the cover 7 by means of plugged-on spring elements 46, 47 or shielding directly and intensifying the RF-shielding. For particularly critical assemblies or parts thereof, small diecast housings 13, 14 are put in place on the transmission and/or reception assembly on the components side of the printed circuit board. The shielding in the underside of the printed circuit board ensues by means of webs 15 which project from the diecast floor 10 of the housing and establish contact with the solder side of the printed circuit board, preferably via spring elements. In order to achieve an optimally favorable heat dissipation from hot components, these components (component referenced 16 in FIG. 1) are advantageously disposed such that they are contacted in the direct proximity of or between integrally cast cooling ribs 43 at the top side of the flat pack or housing.

The digital control assembly 3 and the duplex filter 4 are disposed in the second main chamber 9, these being respectively connected to plug connectors 17, 18 projecting in a weatherproofed manner through the diecast wall at the underside of the flat pack or housing.

Figure 4:
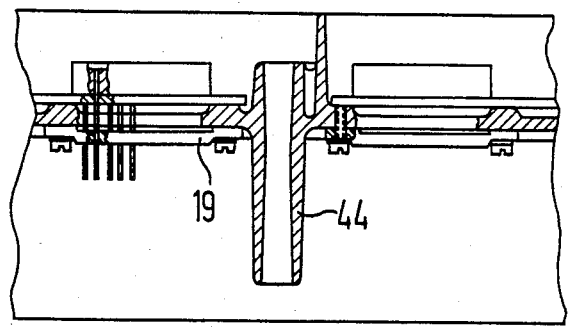
FIG. 4 is a cut partial view of the flat pack or housing in the region of the bottom plate.

The electrical connections between the individual assemblies at both sides of the bottom plate 10 are produced by centrally disposed plug connector elements fashioned as tabs 19 for the desired compact structure, these producing the shortest conducting paths. The plug connector elements 19 are inserted into the bottom plate 10 at both sides of a guide 44 which is co-cast into the bottom plate for a central screw 23 (FIG. 4).

The RF-connections are produced via RF-shielded cables 20 with separable and solderable cable ends. The external shielding of the assemblies is provided via the covers 6, 7. The two covers are put in place on the tub-like main chambers 8, 9 and contact the flat pack or housing 5 via sealing elements 21, 22 which are disposed recessed on all sides. The covers are held in contact with the housing 10 and are secured to one another and to the housing 10 via the single central screw 23 which engages into bores disposed in depressions of the covers 6, 7 and into the guide 44 in the bottom plate. In order to produce adequate contact, the covers 6, 7 are prestressed. The central screw 23 is formed such that it can be sealed with lead in order to prevent unauthorized opening.

Guide rails 31 are attached, preferably integrally cast, at the mutually opposite narrow sides of the flat pack or housing 5. These guide rails are provided for the acceptance of the radio apparatus in a support mount which includes funnel shaped guide channels 32 disposed corresponding to the guide rails 31 and preferably composed of an elastic material in order to prevent scratching of the lacquer surface of the radio apparatus and in order to act as dampeners for vibrations.

Figure 5:
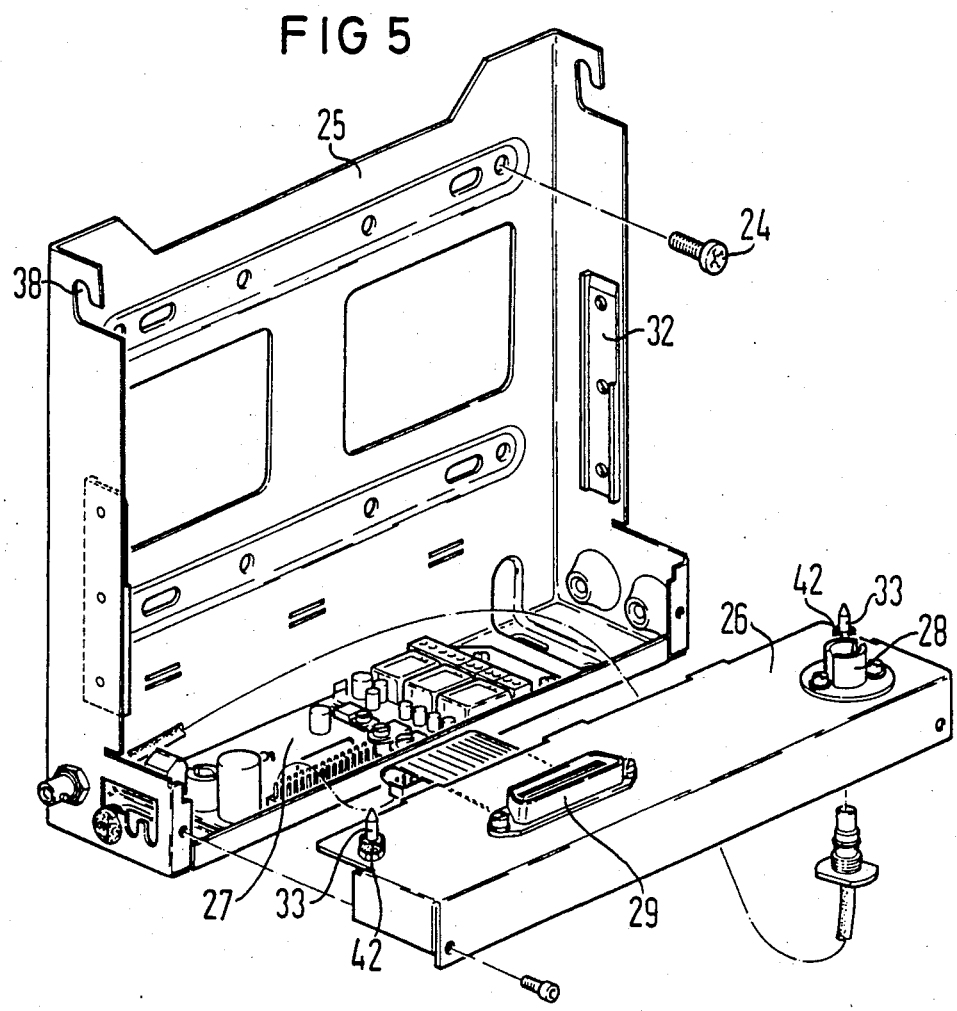
FIG. 5 is a perspective view of the support mount for the flat pack or housing.

The support mount shown in FIG. 5 is composed of a sheet metal panel 25 bent at approximately 90° at three sides. Two lateral panels lying opposite one another have the guide channels 32 mounted thereon at an inside surface. A bottom panel is fashioned such that it forms a closed chamber with a second bent sheet metal panel 26. One or more assemblies 27 are disposed in this latter chamber.

By omitting or adding components and plug connectors, the possibility is thus provided of enabling auxiliary functions such as monitoring via a loudspeaker, connection of a hand-free microphone or attachment of data equipment, in accord with the user's wishes without performing operations on the radio apparatus itself. The radio apparatus can thus be used in a flexible way for different use locations. Fastening of the mount 25 can be carried out in various planes or levels with screws 24 at a wall or a floor or in the trunk of vehicle.

Cooperating plugs, namely the antenna plug 28 and the device plug 29 for the radio apparatus are mounted in such a manner to the top side of the second sheet metal panel 26 forming the chamber termination that they accept the tolerances of the plugs.

Figure 6:
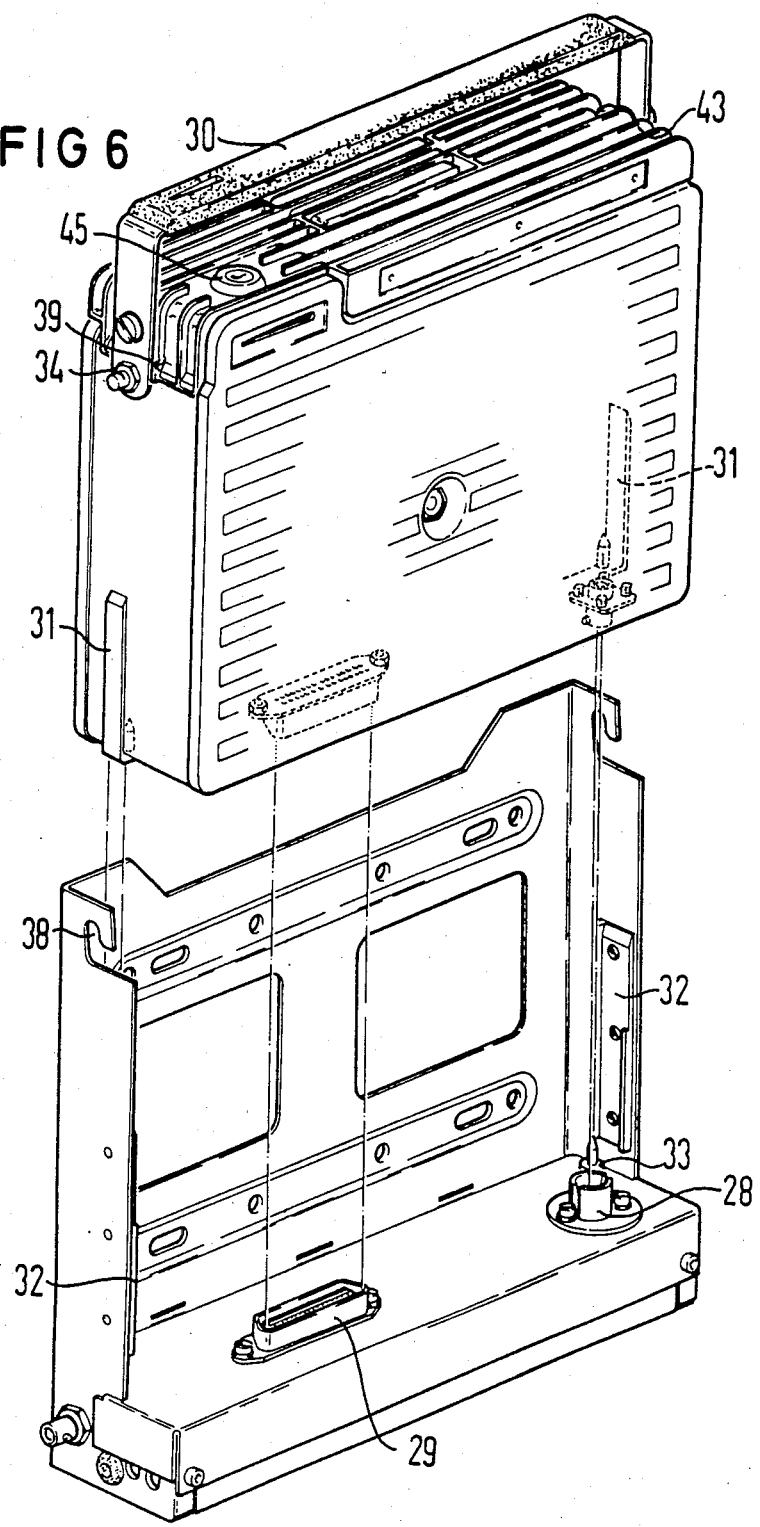
FIG. 6 is a perspective view of the radio apparatus being mounted on the support mount.
Figure 8:
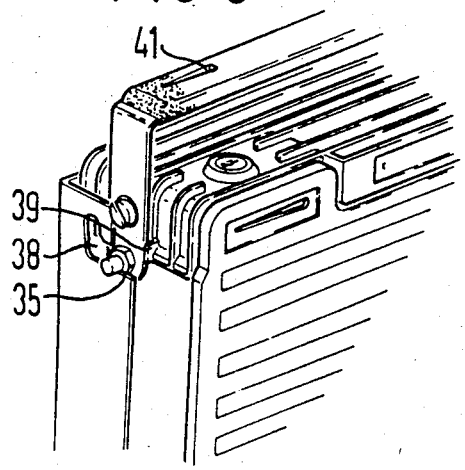
FIG. 8 is a partial perspective view of the mounted radio apparatus in the region of the carrying shackle showing an unlocked position.

A pivotable carrying shackle or handle 30 having a grip portion and perpendicularly angled lateral arm portions is attached to the flat pack or housing 5 near the top side thereof by means of pivot pins. For insertion into the support mount, the carrying shackle 30 is rotated to an orientation shown in FIGS. 6 and 8 parallel to the plane of the openings of the housing. The radio apparatus is pressed against the panel 25 forming the back wall of the support mount and is inserted parallel to the back wall. The guide rails 31 integrally cast laterally to the flat pack or housing thereby engage into the guide channels 32 of the support mount. Immediately before the engagement of the plug connectors, two guide pins 33 projecting from the upper side of the second panel 26 of the support mount provide a precise adjustment of the radio apparatus relative to the support mount in order to avoid damage to the plug connectors. The push-in motion of the radio apparatus is brought to a standstill through the use of two pins 34 attached to the carrying shackle 30 at the angled lateral arms which strike against an edge 35 of a recess 38 at the top side of the angled lateral panels of the support mount.

Figure 7:
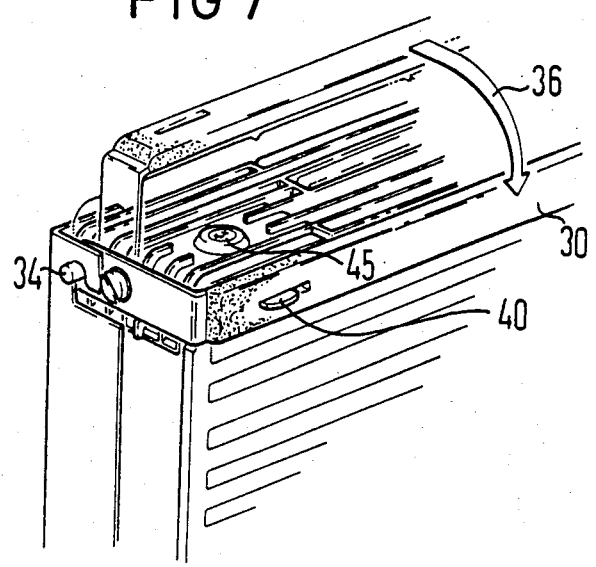
FIG. 7 is a partial perspective view of the mounted radio apparatus in the region of the carrying shackle showing a locked position.

The carrying shackle 30 that had thereto been hinged up vertically is now moved 90° toward the front, as shown by arrow 36 in the partial view of FIG. 7. The pins 34 of the carrying shackle 30 thereby slide on a correspondingly fashioned curve of the recess 38 which forms a cam-like slot into the angled lateral parts of the panel 25. The plug connectors thereby engage exactly into one another and the plugging forces are overcome without great exertion. Two projections 39 laterally cast on the housing prevent an improper pivot of the carrying shackle toward the wrong side, so that damage due to overload on the guides is not possible.

A tapered slot 41 is provided in the carrying shackle 30 in the central gripping part thereof. A bolt 40 of a lock 45 is mounted in the top side of the flat pack or housing in a corresponding position to engage with the slot 41 when the carrying shackle is pivoted down, this lock being turned forward with a patent key. Two rubber-like bumpers 42 mounted on the guide pins 33 in the support mount press the radio apparatus up such that the bolt 40 of the lock 45 and the two pins 34 at the carrying shackle 30 are pressed against corresponding abutments and play between the radio apparatus and the support mount is avoided.

After the lock has been unlocked, the removal of the apparatus from the support mount ensues by pivoting the carrying shackle 90° up. The pluging forces are thereby unproblematically overcome by the leverage and the radio apparatus can be removed from the support mount without particular exertion.

As is apparent from the foregoing specification, the invention is susceptible of being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim as our invention:

1. A housing for a radio apparatus having a rectangular cross-section with an opening at the front side and an opening at the back side which are respectively closable with a cover, comprising:
   a bottom plate dividing the housing into two tub-shaped main chambers, the bottom plate being oriented parallel to the plane of the openings;
   radio assemblies preferably composed of printed circuit boards equipped with components being disposed in one main chamber as well as antenna and control devices being disposed in the other of said main chambers;

means for RF shielding said radio assemblies and said antenna and control devices in said chambers;

plug connector elements for the electrical connection of said antenna and control devices in both main chambers inserted in said bottom plate in a central position;

sealing elements disposed recessed along the circumference of said front side and back side openings to contact the covers which are put in place on the tub-shaped main chambers and are secured to one another and to the housing via a single central screw;

outside guide rails provided on the housing at two side faces lying opposite one another for acceptance into a support mount; and a carrying shackle pivotally attached near the top side of the housing, said carrying shackle serving for latching when the radio apparatus is inserted into said support mount.

2. A housing according to claim 1, being composed of a pressure diecast housing of aluminum.

3. A housing according to claim 1, wherein at least one of said main chambers are subdivided by partitions.

4. A housing according to claim 3, wherein said partitions contact the covers via plugged-on spring elements.

5. A housing according to claim 3, wherein said bottom plate and partitions are co-cast into the housing.

6. A housing according to claim 1, wherein said support mount is comprised of a sheet metal panel bent at an angle at a plurality of sides, one of said sides forming a closed chamber with a second, bent sheet metal panel, said closed chamber accepting further electrical assemblies.

7. A housing according to claim 6, wherein said further assemblies are designed in accord with the special auxiliary functions of the radio apparatus.

8. A housing according to claim 6, wherein plug connector elements are disposed at an upper side of said second panel of said support mount, said plug connector elements engaging with corresponding plug connector elements at the under side of the radio apparatus.

9. A housing according to claim 6, wherein funnel shaped guide channels are disposed at the inside of the angled lateral sides of the sheet metal panel for the support mount, said guide rails of the radio apparatus being correspondingly fashioned to engage into said guide channels.

10. A housing according to claim 9, wherein said guide channels are composed of elastic material.

11. A housing according to claim 1, wherein said carrying shackle has a central gripping part and opposed angled end portions, said end portions being pivotally connected to opposite lateral sides of said housing.

12. A housing according to claim 11, wherein outwardly directed pins are provided on said carrying shackle at said angled ends, said pins being guided laterally in the support mount panel in cam-like slots when said carrying shackle is pivoted.

13. A housing according to claim 11, wherein a tapered slot is provided at said central part of said carrying shackle, and a bolt of a lock is mounted in the radio apparatus to engage into said slot when the radio apparatus is inserted into said support mount and said carrying shackle is pivoted forward by 90°.

14. A housing for a radio apparatus having a rectangular cross-section with an opening at the front side and an opening at the back side which are respectively closable with a cover, comprising:

a plate dividing the housing into a plurality of tub-shaped chambers;

radio assemblies as well as antenna and control devices being separately disposed in various ones of said chambers;

plug connector elements for the electrical connection of said antenna and control devices in said chambers inserted through said plate;

a single central screw engagable with both covers to secure the covers to one another and to the housing;

outside guide rails provided on the housing at two side faces lying opposite one another for acceptance into a support mount; and a carrying handle pivotally attached near the top side of the housing, said carrying handle including means for latching the radio apparatus to said support mount.

* * * * *